US009433336B2

(12) United States Patent
Mazumder

(10) Patent No.: US 9,433,336 B2
(45) Date of Patent: Sep. 6, 2016

(54) SELF-CLEANING SOLAR PANELS AND CONCENTRATORS WITH TRANSPARENT ELECTRODYNAMIC SCREENS

(71) Applicant: Trustees of Boston University, Boston, MA (US)

(72) Inventor: Malay K. Mazumder, Belmont, MA (US)

(73) Assignee: Trustees of Boston University, Boston, MA (US)

( * ) Notice: Subject to any disclaimer, the term of this patent is extended or adjusted under 35 U.S.C. 154(b) by 438 days.

(21) Appl. No.: 13/909,523

(22) Filed: Jun. 4, 2013

(65) Prior Publication Data

US 2013/0263393 A1 Oct. 10, 2013

Related U.S. Application Data

(63) Continuation of application No. PCT/US2011/063754, filed on Dec. 7, 2011.

(60) Provisional application No. 61/420,456, filed on Dec. 4, 2010.

(51) Int. Cl.
*A47L 13/40* (2006.01)
*F24J 2/46* (2006.01)
*H01L 31/0236* (2006.01)

(52) U.S. Cl.
CPC ............. *A47L 13/40* (2013.01); *F24J 2/461* (2013.01); *H01L 31/02366* (2013.01); *Y02E 10/40* (2013.01); *Y02E 10/52* (2013.01)

(58) Field of Classification Search
CPC ............ H01L 31/02366; F24J 2/461
USPC ....................................... 136/256
See application file for complete search history.

(56) References Cited

U.S. PATENT DOCUMENTS 7,999,173 B1* 8/2011 Ashpis ............... H01L 31/042
136/244
2004/0055632 A1* 3/2004 Mazumder ............ F24J 2/461
136/244
2007/0295399 A1* 12/2007 Carlson .......... H01L 31/022433
136/261

FOREIGN PATENT DOCUMENTS

WO 01-05514 A1 1/2001

OTHER PUBLICATIONS

Sims et al., Development of a Transparent Self-Cleaning Dust for Solar Panels, IEEE conference proceedings, pp. 1-8 (2003).*
Sims et al., "Development of a Transparent Self-Cleaning Dust Shield for Solar Panels," Proceedings of ESA-IEEE Joint Meeting on Electrostatics 2003, Laplacian Press, pp. 814-821.

* cited by examiner

*Primary Examiner* — Jayne Mershon
(74) *Attorney, Agent, or Firm* — BainwoodHuang

(57) ABSTRACT

A transparent electrodynamic screen (EDS) enables automatic removal of dust to protect and enhance performance of solar collectors and similar components. A pattern of transparent conductive electrodes are deposited over a glass or polymer outer surface of a solar collector, and embedded under a thin, transparent dielectric fluoropolymer film or silicon dioxide coating. When energized by three-phase voltages at frequencies in the range 5 to 20 Hz, the electrodes produce an oscillating electric field and a traveling electrodynamic wave that charges the particles on the surface and exerts coulomb and dielectrophoretic forces to lift the dust from the surface and transport it to an edge of the collector, thereby clearing the screen. The EDS can be incorporated in the collector in an integrated way during manufacture or retrofitted to existing conventional collectors.

9 Claims, 4 Drawing Sheets

SELF-CLEANING SOLAR PANELS AND CONCENTRATORS WITH TRANSPARENT ELECTRODYNAMIC SCREENS

BACKGROUND

Solar photovoltaic (PV) and solar photothermal (PT) systems can meet global electrical energy needs. However, due to solar energy's low power density, megawatt to gigawatt scale PV/PT plants require a large area for installations and are best suited for semi-arid and desert regions. These areas are the sunniest but also the dustiest locations in the world. Deposited dust strongly adheres to solar panels and solar concentrators and obscures the solar radiation reaching the PV cells and mirrors, reducing energy conversion significantly. Deposition of only four grams of dust (with particle size in the range from 0.5 to 10 μm in diameter) per square meter on a panel may reduce power output by 40%.

U.S. Pat. No. 6,911,593 of Mazumder et al. describes an electrodynamic shield embedded within a thin transparent dielectric film or a sheet used to remove dust deposited on solar panels.

Some of the major difficulties in applying EDS on solar panels include (1) avoiding interactions between the electric field of the EDS electrodes and current collecting grids used in solar panels for providing electrical power, (2) scaling of the method of EDS construction for manufacturing and installing transparent electrodes on solar panels and solar concentrators, (3) obscuration of solar radiation caused by the placement of the EDS on the surface of solar panels and concentrators, (4) retrofitting existing solar photovoltaic and photothermal devices with self-cleaning EDS systems, (5) environmental degradation of polymer films under outdoors condition, (6) maintaining the efficiency of heat dissipation of solar panels integrated with EDS, and (7) cost-effective manufacturing of new solar panels and solar concentrators integrated with electrodynamic screens for large-scale installations.

Efforts to maintain solar panels and solar concentrators clean have been investigated by a number of researchers. However, the current methods are limited to manual cleaning of solar collectors with water and detergents. A soft brush with a long handle is generally used. Some reported technologies on self-cleaning glass involve passive surface treatment methods to modify the front surface to be either highly hydrophilic or highly hydrophobic.

One commercial product available for building applications is the hydrophilic self-cleaning glass coated with a thin layer of photoactive crystalline titanium dioxide ($TiO_2$) particles. When UV radiation is incident on the $TiO_2$ coated glass, the surface becomes highly hydrophilic and its moisture absorbing capacity increases substantially. When the surface is cleaned with water or is exposed to rainfall, the wetting characteristics of the glass plate help the surface to be easily cleaned. Deposited dust can be washed away due to the super hydrophilic property of the glass. However, the process has major limitations: (1) there is high reflection loss of sunlight since the refractive index of $TiO_2$ is higher than that of the glass, (2) water (or rain) is needed to remove the dust, and (2) presence of UV radiation (wavelength shorter than 380 nm) is needed to activate the surface. In semi-arid and desert areas water is scarce and rainfall is infrequent.

Application of highly hydrophobic surface has also been reported for minimizing adhesion of dust on glass plates. Super hydrophobic transparent films or plates based on nanostructured properties have very low surface energy, which minimizes van der Waal and capillary adhesion forces between the dust particles and the glass surface. The electrostatic forces of adhesion are not decreased. When exposed to outdoor conditions the hydrophobic properties of the surface are adversely affected by UV radiation and dust deposition, limiting the durability of super hydrophobic surface less than a few months.

Methods involving mechanical cleaning of panel surfaces by applying vibration, using wipers, moving transparent films over the panel surface, and using water have also been reported. Applications of electrostatic and electromagnetic fields for controlling particle motion have also been published. However, these reports have tended not to address the development of manufacturing processes involved in the fabrication and installations of electrodynamic screens (EDS) on solar panels and solar concentrators (mirrors and lenses) for removing dust and providing self-cleaning properties of solar photovoltaic (PV) and solar photothermal (PT) systems.

SUMMARY

The present disclosure is directed to transparent electrodynamic screens (EDS) for protecting solar panels and solar concentrators using automatic and efficient dust removal. Disclosed electrodynamic screens include rows of transparent parallel electrodes embedded within a transparent dielectric film. When the electrodes are activated by phased voltage, the dust particles on the surface of the film become electrostatically charged and are removed by the alternating electric field. Over 90% of deposited dust can be removed within minutes, using a very small fraction of the energy produced by the panels. No water or mechanical action is involved. Also described are processes for manufacturing self-cleaning solar panels and concentrators, with emphasis on scalability, durability and on large-scale production cost. Processes are described for both retrofitting existing solar PV and PT plants with electrodynamic screens, and for manufacturing of solar panels and solar concentrators (mirrors, lenses, and glass envelope of the central receivers) with integrated EDS for their future applications.

In one aspect, a film assembly is disclosed that is usable to self-remove particles of material such as dust deposited thereon. The film assembly includes a transparent fluoropolymer film and a set of elongated conductive electrodes carried by the film. The electrodes are configured to be connected to a source of pulsed electrical power and to generate an electric field across a surface of the film in response to the pulsed electrical power. The electric field is of sufficient strength to remove the particles from the surface. The electrodes are separated from adjacent portions of the film by a coating of a dielectric material having substantially higher dielectric strength than a dielectric strength of the film to protect the film from dielectric breakdown during operation. In one embodiment the coating is a coating of $SiO_2$ material.

An acrylic/hexamethoxymethylmelamin (HMMM) film with a low molecular weight urethane diol can also be used to achieve improved the exterior durability. The formulation can be stabilized with a hindered amine light stabilizer (HALS). HALS is an acetylated low pKb value compound and does not inhibit the curing reaction of acid catalyzed coatings with 1% of HALS used in the formulation.

The film assembly, incorporated with EDS is placed over the solar collectors (PV modules, lenses, parabolic troughs, mirrors) forming part of a solar energy system. The EDS film will have a self-adhesive backing with pressure sensitive adhesive (PSA, such as Silgrip PSA 518), that would allow placement of the film on the PV module surface for self-cleaning action. Application of the vacuum lamination process provides an efficient method for retrofitting the EDS films. Production of such a film will make the transparent EDS application versatile and attractive for both new and existing PV modules; the film will be replaceable in case there is any environmental degradation of the film. In use, the film assembly is connected to a pulsed power supply that provides the pulsed electrical power to the film assembly of each of the solar energy panels of the system. The pulsed electrical power has voltage amplitude sufficiently high to cause the electric field to be of sufficient strength to remove the particles from the surface of the film of the film assembly of each of the solar energy panels during operation.

In another aspect, methods of manufacturing EDS integrated solar collectors are also disclosed. Manufacturing of PV modules, mirrors, lenses, and glass envelope of the central receivers integrated with EDS may provide most cost-effective solution to mitigate environmental degradation of solar collectors caused by dust deposition.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

The present disclosure is directed to methods, structures and functionality related to electrodynamic screens (EDS), including the following:

(1) integrated manufacturing process for solar panels with transparent EDS system, (2) retrofitting existing solar panels with transparent flexible electrodynamic screens, (3) design of electrodes: structures and materials, (4) pretreatment of an EDS substrate before electrode deposition, (5) deposition of electrodes, (6) embedding electrode assembly within a transparent dielectric film (7) optimization of the surface and volume conductivities of the dielectric film, (8) incorporation of anti-reflecting and light trapping surface structures on the front surface of the electrodynamic screens, (9) integrated manufacturing of solar concentrators (mirrors and parabolic troughs for reflecting light and Fresnel lenses for focusing light) with transparent flexible electrodynamic screens,

(10) minimizing UV radiation related damage to the EDS and improving durability in outdoor applications,

(11) adding sensors and control systems for automated removal of dust when needed thus conserving power, and

(12) maintaining the efficiency of heat dissipation.

One major application of EDS integration with solar photovoltaic (PV) panels and concentrated solar power (CSP) systems is to solve the challenge of maintaining full power output of the solar installations in dusty regions without requiring water and manual cleaning Minimizing loss of power due to dust deposition can provide manifold savings compared to the cost of initial installation of the EDS technology. Additionally, load mismatch problems caused by dust deposition can also be mitigated.

There are several applications of self-cleaning EDS including:

1. Solar PV systems (rigid PV panels and thin film PV panels),

2. Solar concentrators (mirrors, Fresnel lenses, parabolic troughs, glass envelopes of the central receivers, and other devices used for PT and PV systems), 3. Dust removal from glass plates with textured surface used for light trapping and surface plasmonic devices, 4. Particle collection in electrostatic beneficiation and electrostatic precipitation of powders, 5. Optical windows, surveillance camera lenses, vehicle windshields, and the like, 6. Other devices or systems having a transparent component such as a window, lens, panel or screen, including visual display screens of a computer or other data processing and/or display system, operated in an environment that promotes unwanted deposition of particles such as dust or powder, 7. In-situ monitoring of pharmaceutical powder processing using UV-VIS-IR radiation, 8. Containment, manipulation or control of particulate material such as dust and powder, wherein the EDS may be applied to either a transparent or an opaque substrate.

Figure 1:
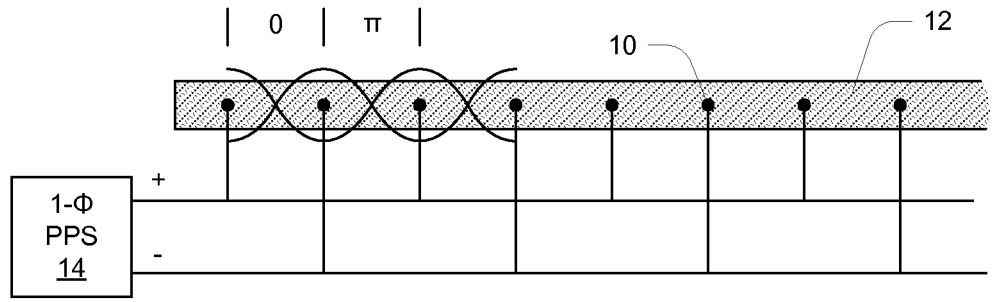
FIGS. 1 and 2 are schematic diagrams of arrangements using an electrodynamic screen (EDS)
Figure 2:
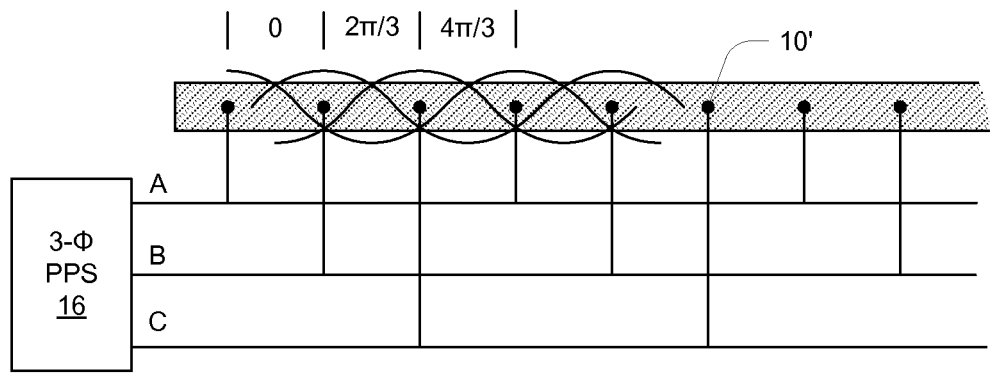

FIGS. 1 and 2 illustrate the basic arrangements of an electrodynamic screen (EDS) system. A film assembly 11 (shown in cross section) includes a pattern of conductive electrodes 10 embedded within a dielectric film 12. The electrodes 10 can be energized either by using a single-phase or by a polyphase AC drive signal. FIG. 1 shows the electrodes 10 activated using a single-phase pulsed power source (1-Φ PPS) 14. The single-phase outputs are labeled "+" and "−", and the field components are shown as "0" and "π". FIG. 2 shows the electrical connections for the electrodes 10' for a three-phase pulsed power source (3-Φ PPS) 16. The three-phase outputs are labeled "A", "B", and "C", and the field components as "0", "2π/3") (120°, and "4π/3") (240°. The single-phase excitation of FIG. 1 produces a standing wave between the electrodes 10, and the polyphase drive of FIG. 2 produces a traveling wave. The distribution of the electric field E is non-uniform with respect to the spatial coordinates x and z (vertical and left-right in FIGS. 1 and 2), and the field strength E varies with time (t). As described below, the dielectric film 12 is preferably a fluoropolymer film such as ethylene tetrafluoroethylene (ETFE).

The standing wave produced by single-phase excitation works for removing particles in the following manner. A standing wave can be considered as the superposition of two traveling waves moving in opposite directions. Thus any instability in the ac electric field, the presence of harmonics in the applied field, or any air currents on the top surface of the panel produce a drift velocity to transport the dust particles levitated by the electrodynamic forces from the surface to move away from the screen. Since the PV panels are always tilted with respect to the horizontal plane, gravitational force also helps in sliding off the levitated dust particles to ground.

Figure 3:
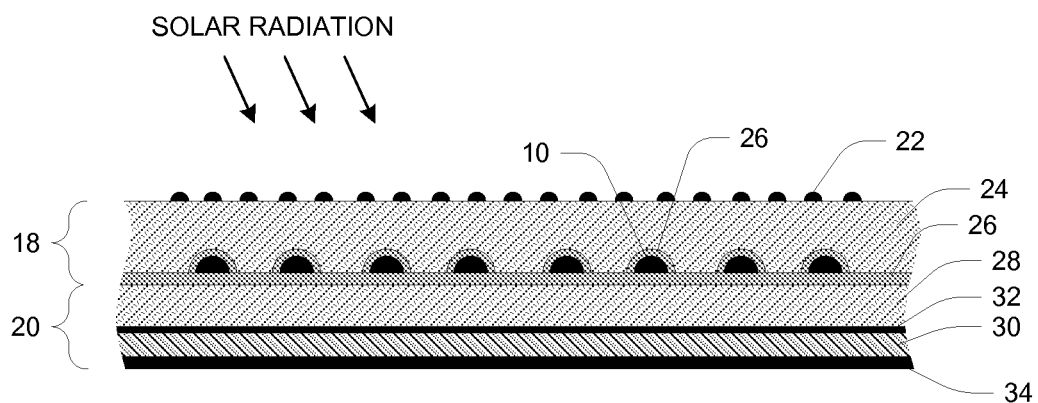
FIG. 3 is a schematic diagram of an electrodynamic screen integrated on a solar panel.

FIG. 3 is a schematic depiction of an EDS 18 integrated on a solar panel 20. The EDS 18 includes an array of nanosized planoconvex lenses 22 used as anti-reflecting and light trapping surface structure on the top surface of the EDS 18; a thin layer of a transparent fluoropolymer 24; a thin layer of $SiO_2$ 26 used for protecting the electrodes 10 against voltage breakdown; the parallel transparent electrodes 10 for applying an electrical field; a borosilicate cover glass plate 28 of a solar panel; a semiconducting film for light absorption 30 of the solar panel 20; a layer of current collecting grids 32 for the solar panel 20; and a current collecting metal back plate 34 of the solar panel 20. In one embodiment, the fluoropolymer film 24 is an ethylene tetrafluoroethylene or ETFE film.

Figure 4:
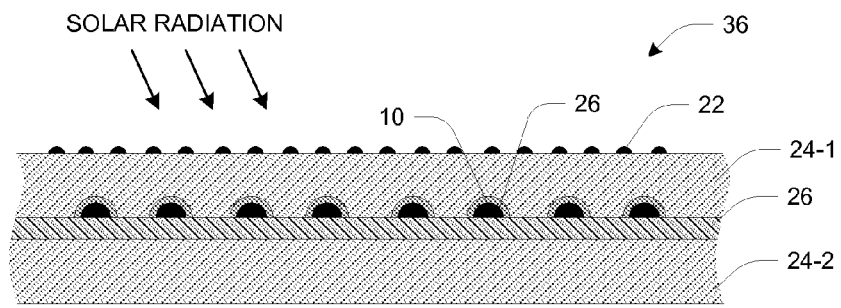
FIG. 4 is a schematic diagram of an electrodynamic screen for retrofitting existing solar panels and Fresnel lenses used for concentrated PV modules.

FIG. 4 is a schematic diagram of an electrodynamic screen 36 for retrofitting existing solar panels. This structure is similar to the EDS 18 of FIG. 3 except that the fluoropolymer layer 24 has two sub-layers 24-1 and 24-2. The bottom of sub-layer 24-2 can be adhered to a cover of an existing solar panel or concentrator using any of various techniques. For example, the bottom surface of the EDS film 24-2 may have a self-adhesive backing with pressure sensitive adhesive (PSA, such as Silgrip PSA 518), that allows placement of the film aided by vacuum lamination on the PV module surface for self-cleaning action.

Figure 5:
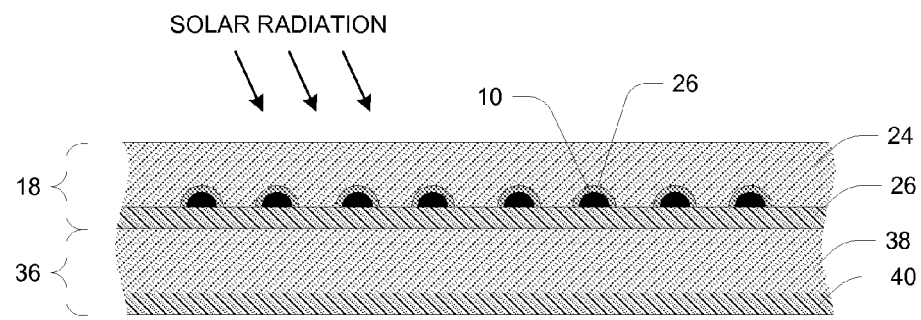
FIG. 5 is a schematic diagram of an electrodynamic screen integrated with a solar concentrator mirror.

FIG. 5 is a schematic diagram of an electrodynamic screen 18 integrated with a solar concentrator mirror 36. This structure is similar to that of FIG. 3, with the concentrator mirror 36 being a back-surface mirror including a borosilicate or low-iron cover glass plate 38 and a silver coating 40. In alternative embodiments a polymer may be substituted for the plate 38 for flexibility.

A solar panel such as that of FIG. 3 or 5 is deployed along with an external component or system for energy use or storage. In the case of a PV panel, it may be used in conjunction with a battery or a more extensive electrical distribution grid that delivers electricity from the PV panel to electrical loads. A solar concentrator mirror may direct concentrated solar heating to a pipe or similar vessel for heating a working fluid, whose heat content may be used directly or indirectly such as through a turbine or similar converter.

Figure 6:
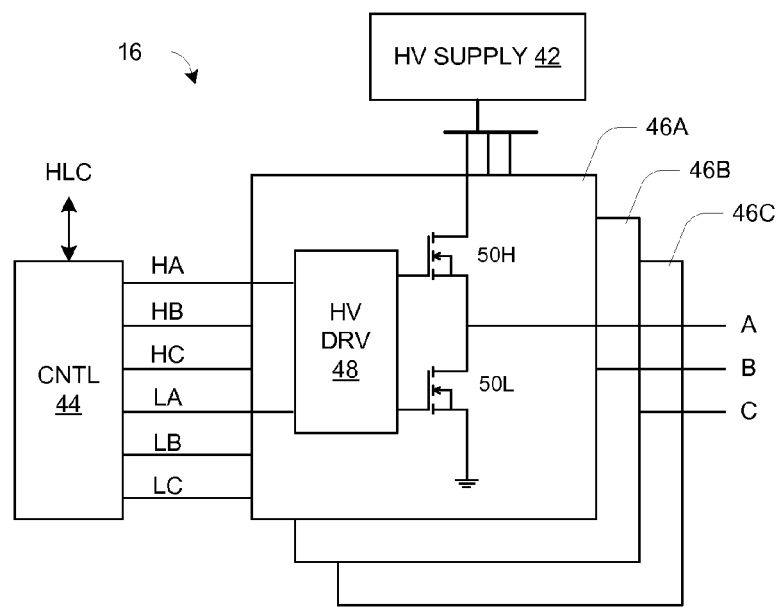
FIG. 6 is a schematic diagram of a three-phase pulsed power source.

FIG. 6 is a schematic diagram of a three-phase pulsed power source (PPS) 16 for connection to a three-phase EDS screen such as in FIG. 2. The PPS 16 includes a high voltage DC power supply (HV SUPPLY) 42, control circuitry (CNTL) 44, and three power switching circuits 46A, 46B and 46C for driving three separate sets of electrodes 10 with respective phase signals A, B and C as described above with reference to FIG. 2. Each power switching circuit 46 includes a high voltage driver (HV DRV) 48 and a pair of MOSFET power switching transistors shown as a high-side switch 50H and a low-side switch 50L. The DC voltage from the HV DC power supply 42 may be in the range of 750 to 1250 V. In operation, the control circuitry 44 generates three-phase pulse control signals shown as HA, HB, HC, LA, LB, LC to cause the transistors 50H, 50L to provide pulsed high-voltage power to the electrodes 10. The overall power requirement may be on the order of 10 watts per square meter of panel. Considerations for selection of operating frequency are given below. It should be noted that in some embodiments, the HV supply 42 may obtain power from the panel(s), which is generally possible because the energy requirements for cleaning are substantially lower than the total energy provided by the panel(s). Typical energy requirement per cleaning is approximately 1.0 $Wh/m^2$ (watt-hour per square meter) of the PV module.

It will be appreciated that the exact pattern and uniformity of the electric field on the surface of the EDS may vary based on the shapes, sizes and spacing of the electrodes 10. When electrodes having relatively large dimensions and large inter-electrode spacing are used, the spatial distribution of the divergent electric field intensity across the surface may be quite non-uniform. As the electrode dimensions and the inter-electrode spacing are reduced, the distribution of the divergent electric field becomes more evenly spaced across the surface of the screen. Such an even distribution of non-uniform electric field results in more uniform cleaning of the dust layer over the surface. It is believed that using a triangular (or pyramidal) cross-sectional shape for the electrodes 10 may provide more uniform field distribution than alternative shapes such as square or rectangular. It is desirable to minimize the ratio of surface area covered by the electrodes to the total area of the EDS and optimize the electrode geometry for maximum cleaning efficiency. The thickness of the film may also be optimized to obtain maximum protrusion of the field lines above the surface yet providing protection of the electrodes against weather related degradation.

In one particular embodiment, a set of parallel transparent Indium Tin Oxide (ITO) electrodes 10 of rectangular cross section (width 100 μm, height 20 μm) are deposited with an inter-electrode spacing of 1000 μm. The electrodes are embedded within a polyurethane (PU) film coating with a film thickness of 50 μm. The thickness of the electrodes can be varied from 10 to 100 μm and the inter-electrode spacing from 100 μm to 1000 μm respectively for EDS operation.

Figure 7:
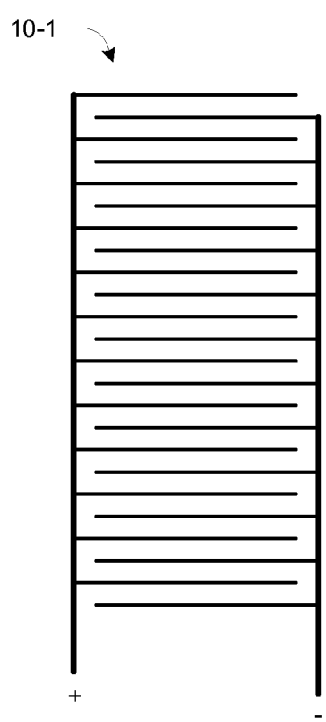
FIGS. 7 and 8 are schematic layouts of electrodes.
Figure 8:
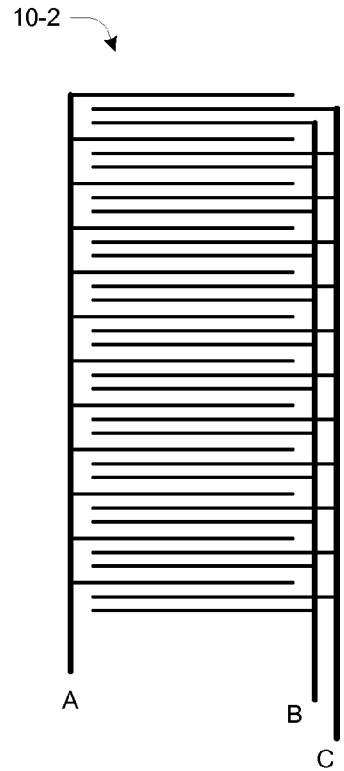

FIGS. 7 and 8 show schematic layouts of single-phase EDS electrodes 10-1 (FIG. 7) and three-phase EDS electrodes 10-2 (FIG. 8). In the arrangement of FIG. 8, the electrodes connected to the rightmost bus bar C cross over the bus bar B carried by an insulating film disposed between the B and C sets of electrodes, a technique generally known in the art. Layouts such as those of FIGS. 7 and 8 can be used for ink-jet or screen printing of the electrodes 10 on a transparent substrate.

Figure 9:
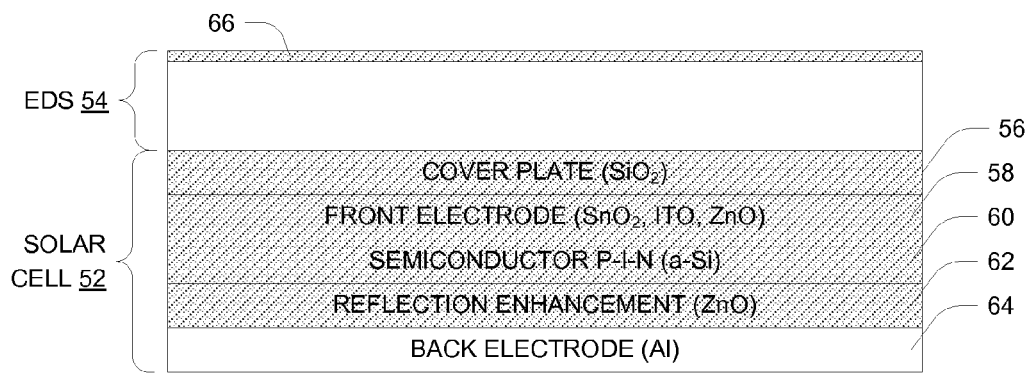
FIG. 9 is a schematic diagram of a thin film amorphous silicon (a-Si) solar cell supported by an aluminum back electrode and a glass cover plate with an integrated EDS.

FIG. 9 shows a thin film amorphous silicon (a-Si) solar cell 52 having an integrated EDS 54. The solar cell 52 includes a cover plate 56; a layer 58 of front electrodes; a semiconductor layer 60; a reflection enhancement layer 62; and a back electrode 64. The semiconductor layer 60 is of amorphous silicon (a-Si) with a p-type-intrinsic-n-type (P-I-N) doping structure. The top surface 66 of the EDS 54 may have nano-texturing applied to trap more light within the structure and reduce reflection loss.

A solar panel as disclosed herein may use solar cells selected from a group including monocrystalline and multicrystalline solar cells, amorphous solar cells, thin film solar cells including cadmium telluride and chalcopyrite based solar cells, and organic photovoltaic solar cells.

Figure 10:
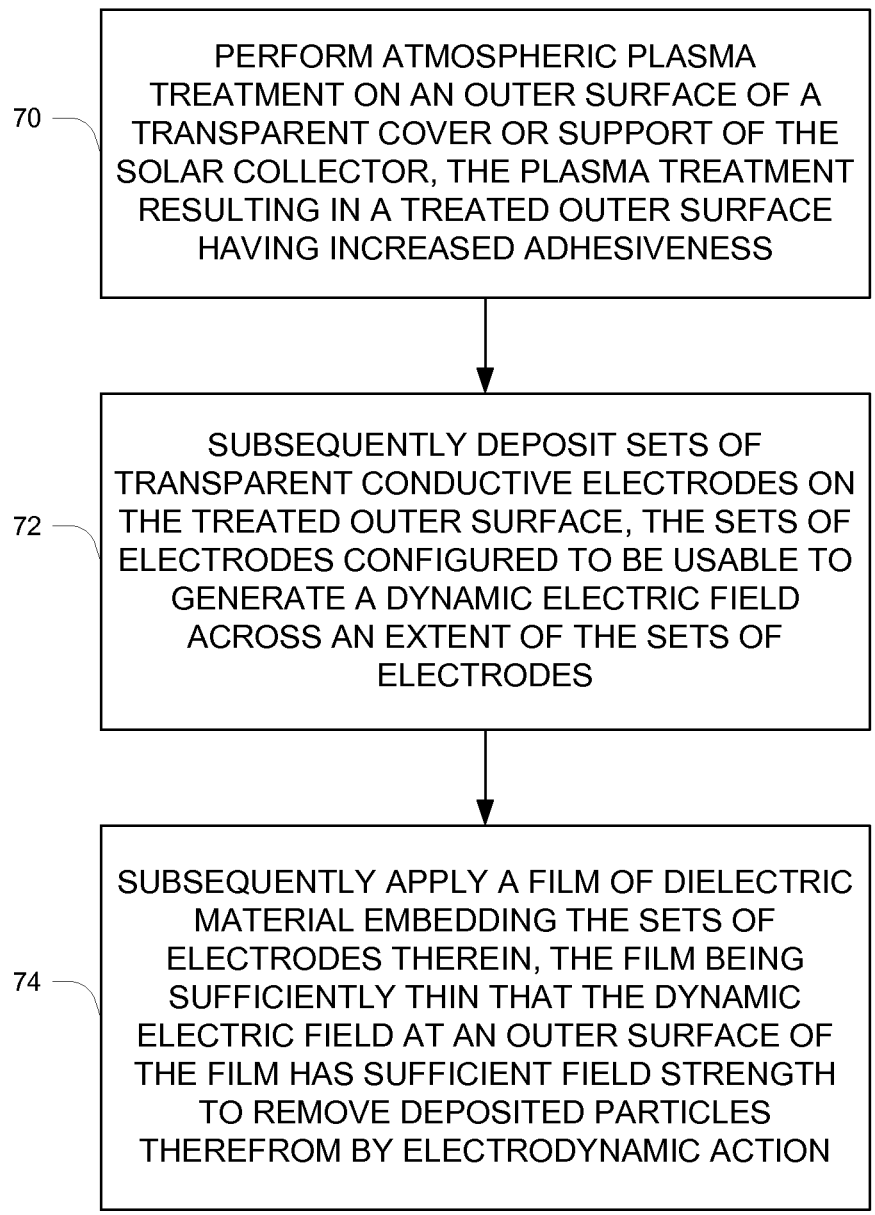
FIG. 10 is a flow diagram of a method of manufacturing a solar collector.

FIG. 10 presents a basic flow diagram of a method for manufacturing a solar collector according to the presently disclosed techniques. At 70, an atmospheric plasma treatment is performed on an outer surface of a transparent cover or support of the solar collector. The plasma treatment results in a treated outer surface having increased adhesiveness. At 72, sets of transparent conductive electrodes are deposited on the treated outer surface. The sets of electrodes are configured to be usable to generate a dynamic electric field across an extent of the sets of electrodes, such as those shown in FIGS. 7 and 8. At 74, a film of dielectric material is applied which embeds the sets of electrodes. The film is sufficiently thin that the dynamic electric field at an outer surface of the film has sufficient field strength to remove deposited particles from the film by electrodynamic action. This film corresponds to the fluoropolymer film 24.

Process and Design Aspects

The following describes various key processing and design aspects of the presently disclosed structures.

1. Integrated Manufacturing Process for Solar Panels with Transparent EDS System (a) The electrodes 10 are made of transparent conducting materials and are embedded within a transparent dielectric substrate 12. These electrodes are to be activated by either using (i) a single-phase AC sinusoidal or pulsed voltage or (ii) a three-phase AC sinusoidal or pulsed voltage. The layout of the electrodes and their electrical connections may be as shown in FIGS. 1 and 2. These figures illustrate the embodiment of a typical electrodynamic screen (EDS). The single-phase excitation (FIG. 1) produces a standing wave between the electrodes and a three-phase drive (FIG. 2) produces a traveling wave.

FIG. 3 shows the placement of the parallel electrodes on borosilicate cover glass plate 28. Most rigid PV panels use glass cover plates for both structural support and environmental protection. Thus, if the EDS production process allows installation of the system on the front surface of the cover glass, the PV panels will have the self-cleaning property. The manufacturing process used for making solar panels can be integrated with a few additional steps for incorporating EDS.

(b) For flexible thin film solar cells, the parallel electrodes 10 are placed on a transparent flexible polymer (such as fluoropolymer) substrate 12.

(c) The methods of integration of EDS with solar panels (rigid or flexible) are nearly identical. The integration of EDS to rigid and flexible solar panels involves three major steps: (i) installation of transparent parallel electrodes (with appropriate width, shape, and inter-electrode spacing), (ii) embedding the electrodes within a transparent UV resistant polymer film (fluoropolymer), and (iii) treatment of the top surface of the polymer film with anti-reflecting and light trapping surface structure.

Adhesion of fluoropolymer film on borosilicate glass surface can be increased by different methods. One of these methods involves mechanical interlocking of the film on the substrates. This method involves first depositing a thin porous film of $SiO_2$ on glass plate (as a conformal coating to cover the electrodes and to improve adhesiveness) followed by the application of electrostatic powder coated thin layer of polymer resin. The resin powder layer is cured for producing a clear film.

2. Retrofitting Existing Solar Panels and Concentrators with EDS (a) The preferred approach is to have the EDS system installed in a thin fluoropolymer film 12, as described in item 1 (b) above, and to attach the film on the top surface of the cover glass 28 of the PV panels and on the glass top surface of the back reflecting minors of CSP. If the EDS is incorporated on a fluoropolymer film 12 with an adhesive backing, it would allow cementing the film on the borosilicate glass plate 28. The polymer film 12 can be placed on the surface over the thin film of $SiO_2$ 26. The adhesive at the backside is a dielectric material (such as epoxy) suitable for applying high voltage pulses to the electrodes. This method has the advantage that if the film degrades after its operation for several years, it can be replaced relatively easily.

In another embodiment, an acrylic/hexamethoxymethyl-melamin (HMMM) film with a low molecular weight urethane diol can be used to achieve improved the exterior durability. The formulation can be stabilized with a hindered amine light stabilizer (HALS). HALS is an acetylated low pKb value compound and does not inhibit the curing reaction of acid catalyzed coatings with 1% of HALS used in the formulation.

(b) A modification method can be used for retrofitting Fresnel lenses and mirrors used for concentrating solar radiation in solar concentrators. For instance, parabolic troughs and minors are often made of metallized polymer film with self-adhesive backing for their use in large-scale concentrated solar power systems. These films can be replaced in the field. EDS-integrated metallized polymer film can be retrofitted in the field for photothermal application.

3. Design of Electrodes: Structures and Materials (a) As previously mentioned, electrodes with triangular cross section may have the most desirable surface distribution of electric field. However, because of the complexity involved in producing electrodes of triangular cross section, hemispherical shaped electrodes may be an optimum choice. The ratio of the electrode width to the inter-electrode spacing (center-to-center) should not be greater than about 10:100 to ensure a minimal loss of transmission of solar radiation by the EDS placed on top of the solar panel. A compromise is generally necessary between the sheet resistance of the electrode material (conductivity of the electrodes) for the capacitive loads involved and the optical transparency.

(b) For good deposition of electrodes on glass or polymer surfaces, the electrodes may preferably be made of: (1) Indium Tin Oxide (ITO), (2) carbon nanotubes (CNT), (3) silver nanowires (Ag—NW) or (4) Al-doped Zinc Oxide (AZO). These materials provide the required conductivity, optical transmittance, durability and convenience of deposition for large sale installations.

(c) The electrode material preferably has a very low surface resistivity, preferably less than 100 $\Omega$/sq. The composition of electrodes such as Indium Tin Oxide (ITO) needs to be controlled to provide optimum values of optical transmission and electrical conductance.

Similarly, for other electrode materials, the thickness, width and composition of the materials are to be adjusted since increasing the conductivity decreases the optical transmittance. The width of the electrodes is preferably in the range of 50 to 100 $\mu$m depending upon the conductivity, and the inter-electrode spacing is preferably in the range 100 to 1000 $\mu$m respectively depending upon the size distribution of the dust particles involved. Smaller electrode width and shorter inter-electrode spacing can be used in cases involving fine particles. As the inter-electrode distance and the width of the electrodes are reduced, the surface density of the divergent electric field on the screen increases and the electrical field lines are more evenly distributed, making the screen more effective in removing the dust from the entire screen. However, as the area covered by the screen electrodes increases, the light transmission efficiency is reduced due to the optical interaction of the electrode materials. Hence a compromise is needed between optical transmittance and surface cleaning of dust.

4. Pretreatment of the Substrate Before Electrode Deposition (a) Surface treatment of the EDS substrate 12 (borosilicate glass, PET or a fluoropolymer) is needed to improve adhesion between the electrodes and the substrates. Atmospheric pressure plasma treatment is the preferred method for cleaning the surface to remove contaminants and to improve adhesion. The electrodes are deposited within a short period after the plasma treatment since the effective lifetime of plasma surface modification is often limited.

(b) If the resistivity of the substrate is low ($<10^{14}$ Ω-cm), it is necessary to coat the substrate with a thin layer of silica ($SiO_2$) which has a resistivity $10^{19}$ Ω-cm. The $SiO_2$ film, with a high dielectric strength ($10^7$ V/cm), provides protection against breakdown of the electrodes A thin film of $SiO_2$ has a refractive index is 1.46 which matches well with that of borosilicate glass. One alternative to $SiO_2$ is silicon nitride ($Si_3N_4$).

5. Deposition of Electrodes (a) Preferred methods of deposition of electrodes on the glass or polymer surface for construction of the EDS (FIG. 3) include (1) ink-jet printing, (2) screen printing, or (3) stencil based spray painting for large scale production. Photolithographic processes can be used for making masters as needed. These methods have been chosen considering the availability of materials, cost, and scalability. Most of these materials to be used as transparent conductive ink are available commercially and can be applied using roll-to-roll manufacturing technique. Application of transparent CNT or Ag NW polymer nanocomposites using ink-jet, screen-printing or stencil/spray painting method is most promising for low-cost production. Optimization of the deposition process may use a combination of different methods for obtaining high resolution and speed.

(b) Since the electrode assembly is to be embedded within a dielectric film 12, with a finite loss factor (necessary for the operation of the EDS), the top surface of the electrodes are coated with a thin layer 26 of $SiO_2$ as shown in FIG. 3. A thin film of $SiO_2$ prevents dielectric breakdown when low frequency (4 to 20 Hz), high voltage (700-1200 V), single- or three-phase pulses are applied to the electrodes. A sol-gel coating process can be used for depositing a layer of approximately 2-5 micrometers in thickness.

6. Embedding Electrode Assembly within a Polymer Film (a) A method for embedding the parallel electrode within a transparent dielectric layer (FIG. 3) is used. A thin polymer layer (approximately 50 µm thick) is needed for EDS operation and for protecting the electrodes from weather related damage when exposed to outdoor conditions. A thick coating (>50 µm) may interfere with the application of the electric field protrusion above the surface. The dielectric material should be transparent in the wavelength range of the PV operation and should be durable against UV radiation when exposed to solar radiation outdoor. A fluoropolymer resin (such as Tefzel®, manufactured by DuPont) meets most of the requirements: (1) more than 90% transparent over the range of solar radiation that can be harvested by the solar cells, (2) UV resistant, (3) excellent contact charging properties, (4) scratch resistant, (5) low refractive index, and (6) moisture resistant. In addition, the polymer surface has a good adhesion property for coating on its surface with a $SiO_2$ film. It is a thermoplastic resin which can be applied by spray coating (in liquid or in powder form) on the surface.

(b) Fluoropolymers are inherently more stable under the solar radiation because of the stronger molecular bonds compared to the hydrocarbon bonds. To improve durability against UV radiation, a fluorescent whitening agent (FWA) may be added to the fluoropolymer resin. The FWA molecules absorb UV photons and undergo fluorescent radiation in the visible range providing additional radiation energy to the solar cells for energy conversion while extending lifetime of the polymer against UV degradation.

7. Optimization of the Surface and Volume Conductivities of the Polymer Film

A method of optimization of the conductivity of the dielectric polymer film 12 has been developed. In order to avoid electrostatic charge accumulation on the front surface of the dielectric layer (fluoropolymer in this case) of the EDS it is necessary to have an optimum surface conductivity. The surface conductivity should be just sufficiently high to drain excessive electrostatic charge, but low enough to allow the electric field lines to cross over the surface as shown in FIGS. 1 and 2. The primary mechanism of dust removal involves electrostatic charging of the dust particles against the surface of the dielectric film and removal of the dust particles by Coulomb force. The charging process is aided by charge leakage from the electrodes. The charge exchange takes place between the dust particles and the film surface. When the charged particles are removed, the polymer surface remains charged with opposite polarity. The surface charge accumulated on the dielectric film should be drained for maintaining the dust charging efficiency of the film. To aid the charging process, the dielectric film must have an optimum conductivity.

8. Incorporation of Anti-Reflecting and Light Trapping Surface Structures on EDS Surface (a) Without any coating, approximately 4% of light is reflected at normal incidence from the front surface of a glass. Another 3 to 4% is reflected from the back surface. Total reflection loss (typically 7% at normal incidence) increases as the angle of incidence increases to 90°, and nearly 100% of light is reflected at grazing incidence. Magnesium Fluoride ($MgF_2$) is commonly used for antireflection coating. Antireflection coatings using hybrid sols of $SiO_2$ and $TiO_2$ can be used with film thickness of $\lambda/4$ where $\lambda$ represents the wavelength of the solar radiation corresponding to the peak power. The refractive indices can be adjusted in both cases; $SiO_2$ sol can be prepared to have a low refractive index n≈1.4 and $TiO_2$ sol can be added to have film with n≈1.7. A three-layer coating (medium, high and low refractive indices respectively) can be added to reduce the reflection loss below 1%. Anti-reflecting coating works best at the normal incidence and for the wavelength ($\lambda$) chosen.

(b) To achieve a broadband antireflection property of the surface and for trapping incident light, pyramid-shaped nanostructured surface may have superior transmittance over a relatively large range of angle of incidence compared to that of the anti-reflecting coating chosen for a single wavelength. The outer surface structure of the fluoropolymer film 12 can be modified for improving transmission efficiency of solar radiation by adding an array of nano-sized plano-convex lenses 22 as shown in FIG. 3. While pyramid shaped texturing of the front surface of the crystalline solar cells and PV panel cover glass is often done for reducing reflection loss and for trapping light, deposition of fine dust on the textured surface can make the application ineffective. However, an EDS-integrated PV panel can be textured by incorporating an array of plano-convex lenses 22 with diameter close to 200 nm for minimizing light reflection losses and improving transmission by focusing light with the nano-lenses. Incorporation of nano-sized lenses (FIGS. 3 and 4) on the front surface of EDS provides both self-cleaning property of the glass and an improvement of the light trapping efficiency. Thus, when EDS is combined with nanostructured lenses (FIG. 3), the two processes have synergistic effects.

9. Integrated Manufacturing of Solar Concentrators (Mirrors for Reflecting Light and Fresnel Lenses for Focusing Light) with Electrodynamic Screens (a) FIG. 5 shows an arrangement of installation of EDS on a back-surface reflecting mirror. In this case, the silver coating is at the backside under the cover glass. As shown the FIG. 5, a thin film of $SiO_2$ is coated by using a sol-gel method before depositing the electrodes. The electrodes are then coated with another thin layer of $SiO_2$. A thin layer of fluoropolymer is then applied to cover the electrode structures. The details of these methods have been discussed in items 1 through 6 above.

(b) In placing EDS on Fresnel lenses, the process of installing EDS is similar to that of the mirror. Most Fresnel lenses are made of polymer material. The step-wise convex side of the planoconvex lens is at the back side while the solar radiation is incident on the front plane side.

10. Minimization of UV Radiation Related Damage to the EDS and Improving Durability in Outdoor Applications (a) Stabilizers, blockers, and absorbers are often used to promote UV resistance. However, the modifications should not compromise the transparency of the plastic in the visible spectrum. The stabilizers react with UV radiation. One of the common stabilizers is called HALS (Hindered Amine Light Stabilizer). These molecules absorb the excited groups and prevent the chemical reaction of the radicals. Fluoropolymer has good UV resistance because of its strong carbon-fluorine (C—F) bond. Fluoropolymer resin (such as marketed by DuPont as Tefzel) has transparency over 94% in the visible range. Polyurethane (PU) and silicone have good UV resistance.

(b) The best UV resistant polymers are the imides, polyimide (PEI) has been used for space applications. Fluorescent whitening agents (FWA) can be added to the polymer. The FWA molecules can absorb UV photons and undergo fluorescent radiation in the visible range providing additional radiation energy to the solar cells for energy conversion. Application of UV stabilizers helps in lowering the temperature of the crystalline solar cells by absorbing high energy photons and radiating part of the energy in the visible radiation.

11. Adding Sensors and Control Systems for Automated Removal of Dust when Needed Thus Conserving Power (a) The control circuitry 44 of FIG. 6 may include a photodiode based sensor used to monitor dust deposition on the panel integrated with EDS. The power output of the panel may also be measured. Once these sensors determine that there is a power loss above a certain threshold limit, the EDS is operated automatically to remove dust.

(b) A set of sensors may also be used to detect the presence of moisture on the panel. Since excessive moisture on the panel increases the surface conductivity, the EDS operation is prevented until the surface moisture is dried off.

12. Maintaining the Efficiency of Heat Dissipation (a) The heat dissipation rate from the solar panel is measured with and without the EDS system. Thermal conductivity and mechanical strength of the EDS system is measured. The conducting electrodes made of carbon nanotubes and the surface textures are likely to provide enough heat dissipation so that EDS incorporation does not increase the operating temperature of the panels.

(b) A temperature monitoring system can be installed to examine if additional cooling process will be necessary. One method of back surface cooling is to use an electro-hydro-dynamic cooling system to lower the temperature of the solar cells.

Electrode Design (a) Electrode Shape and spacing: The distribution of non-uniform electric field on the surface of the screen and the frequency of excitation of the electric field play an important role in the particle removal process. The design of the electrode system (electrode width and the inter-electrode spacing) is optimized for efficient removal of dust without compromising transmission of solar radiation to the solar panels.

However, increasing the spatial frequency of the electrode (number of electrodes per cm) causes additional obscuration of the incoming solar radiation even when the electrodes are transparent (transmittance higher than 90%).

An electric field intensity minima may occur over the middle of the rectangular electrodes that indicates dust may collect in this region. It is desirable to have the field strength of the divergent electric field distributed equally over the entire electrodynamic screen. If there is a significant voltage drop across the length of the electrodes, the electric field will not be equally distributed.

(b) Electrode Connections: FIGS. 7 and 8 show simplified versions of connecting the electrodes 10 for single-phase (FIG. 7) and three-phase (FIG. 8) drives. FIG. 6 shows the three-phase power supply 16, whose outputs A, B and C are connected to the respective sets of electrodes A, B and C.

Field distribution analysis shows that triangular shaped electrodes would be most preferred. For practical purposes, electrodes with hemispherical cross section, as shown in FIGS. 2 and 3, with an inter-electrode spacing approximately 500 to 750 µm, may provide a cost effective compromise between the dust removal efficiency and the transmission efficiency. The width of the electrodes depends upon the conductivity of the electrode material.

(c) Electrode materials: EDS is designed to have electrodes made of transparent conductive material which provides both transparency in the optical spectrum and yet provide a high conductivity. Some of the materials that were investigated under this invention are briefly discussed below.

(1) Indium Tin Oxide (ITO) electrodes: One of the materials most widely used as transparent conductive oxide (TCO) film in solar cells, liquid crystal displays, LED, touch screen panels and in many other devices, is Indium Tin Oxide (ITO). ITO is a solid solution of indium (III) oxide ($InO_2$) and tin (IV) oxide ($SnO_2$) with a typical weight percent ratio of 90% to 10% respectively. ITO is preferred because of its transparency, conductivity and stability. Thin film ITO is deposited commonly using chemical vapor deposition (CVD), sputtering, and e-beam deposition method. These methods require high vacuum and are expensive. A solution based method of deposition of ITO may also be used. ITO thin film has a good adhesion property with $SiO_2$ and is relatively stable against moisture penetration. Its refractive index is 1.7 @ 633 nm and its electrical conductivity is approximately $10^3$ to $10^4$ S/cm, which varies with the weight percent of $SnO_2$. Increasing the concentration of tin oxide increases charge carrier density and conductivity but decreases optical transmission. Since ITO is a n-type conductor with a low resistivity, it is extensively used in c-Si Solar cells. For EDS operation, both p- and n-type conducting materials can be used and sheet resistance requirement is not as critical s the current collecting electrodes for a solar cells. EDS has a capacitive load with very high impedance since the frequency of operation is very low (<20 Hz).

For transmission efficiency 90% or better, the sheet resistance is often more than 100 Ω/sq. The technology for ITO coating is well matured and the most advanced process can provide sheet resistance under 100 Ω/sq and transparency higher than 90% with excellent stability. In the EDS design, the goal is to attain transparency of the film or the glass substrate and the embedded conduction electrodes to have transparency over 90%. Additional AR coating and surface treatments can provide overall transmission of optical wavelength greater than the systems without the EDS.

(2) Carbon Nanotube (CNT) electrodes: Single wall carbon nanotube (CNT) based conductive transparent coating materials are being manufactured by several commercial vendors. CNT coatings are flexible, UV resistant and can be applied by wet deposition methods such as screen printing. The screen printing method can be efficiently applied for preparing electrodynamic screens. In using single-walled CNT coatings, it is also necessary to compromise between higher transparency and better conductivity. Some of the commercial products are available which can be used for transparency close to 90% with sheet resistance of 1000 Ω/sq. The sheet resistance is higher compared to ITO but it provides more a flexible coating. The method has been well advanced for improved adhesion to the substrate and environmental stability. CNT based ink with an appropriate binder can also be spray-coated on glass and polymer substrates, which makes it convenient for manufacturing EDS.

(3) Silver Nanowire (Ag—NW) electrodes: Compared to the CNT coating, silver nanowire electrodes provide low sheet resistance approximately 20 Ω/sq, and comparable optical transmission with respect to using ITO or CNT. While silver is expensive, an added benefit in this case is much thinner electrodes (diameter <10 μm) providing flexibility and environmental stability with a minimal transmission loss.

(4) Graphene electrodes: Solution-processed graphene transparent conductive electrodes can be used for EDS applications. The graphene electrodes can be deposited on glass or PET substrates by spray painting or screen printing using an aqueous dispersion of functionalized grapheme. The coated film is treated by a vacuum annealing process to reduce the sheet resistance. The performance of grapheme electrode is close to that of ITO under ideal conditions.

(5) Al-Doped ZnO (AZO) electrodes: Al-doped ZnO is a n-type conductor and can be deposited using a sol-gel process. The process still requires heat treatment under vacuum. Transmittance in the visible region over 90% can be achieved with a film resistivity approximately $10^{-4}$ Ω-cm. Both sheet resistance and transparency are comparable to that of ITO film. Since AZO is a p-type conductor, it is used extensively for solar cells.

(6) Transparent conducting polymer electrodes: Poly(3, 4-ethylenedioxythiophene) (PEDOT) can be used for electrodes with conductivity around 1,000 S/cm and transparency greater than 80%. However, when PEDOT is modified to form Poly(3,4-ethylenedioxythiophene) PEDOT: poly (styrene sulfonate) PSS compound, the coating process becomes easier with much improved performance as transparent conductive coating film. PEDOT:PSS is widely used in many applications. PEDOT:PSS is prepared by polymerizing EDT monomer in an aqueous solution of PSS using $Na_2S_2O_8$ as the oxidizing agent. This aqueous solution can then be spin coated or spray painted and dried to make a film. The polymer based transparent conductive coating is less stable under UV radiation compared to inorganic TCO.

Methods of Electrode Deposition (a) Ink-jet printing: Large area ink-jet printing is widely used in fabrication in low-cost microcircuit productions particularly for fabricating organic circuits. Since the pattern to be printed can be controlled by computer hardware and software, it is possible to design and test electrodes of different width, spacing, thickness and materials. Most of the large area ink-jet printers employ one of the three types of drop-on-demand printing methods using (1) piezoelectric, (2) acoustic or (3) thermal print heads. In the construction of EDS, all of these methods can be used for inorganic electrodes. For conducting polymers, the thermal print heads should not be used due to possible damage to the functional organic materials such as PEDOT:PSS.

Ink-jet printing is also advantageous for printing electrodes and protective layers to cover electrodes against short circuits. Contact electrodes for both single-phase and three-phase connections (FIGS. 7 and 8) can be made using a single-step and a three-step printing process respectively. Transparent dielectric materials for texturing the front surface for trapping light minimizing reflection losses can be deposited by ink-jet method. The method has been successfully used using glass or polymer substrates.

(b) Screen Printing: Screen printing is one of the oldest technologies but recent advances in photolithography, laser etching, and ink development technologies have made it possible to have high resolution prints generating 30 μm line width and 50 μm spacing on rigid and flexible substrates. Screen-printing method is now routinely used fabricating electronic circuitry in industrial scales. Both conducting and non conducting lines can be produced. Multiple-layer process has been developed via laser hole drilling process. Both conductive and dielectric layers can be screen-printed. These advancements can be used advantageously for printing EDS electrodes on rigid or flexible substrates. In producing electrodes for three-phase drive, a three layer screen printing can be used. Both conducting lines and insulating lines can be printed.

Possible limitations of this method include high resolution electrode layout and control of thickness of the electrodes for controlling transparency and resistivity. High resolution ink-jet, screen, off-set printing methods, with currently achievable resolution of 50 μm, can meet the requirements of making EDS systems for solar panels and solar concentrators. However, as the EDS technology advances, a combination of different technologies may be needed for low-cost high-performance electrodynamic dust shields. It is also anticipated that both screen and ink-jet printing technologies will advance for large area printing on flexible or rigid substrates.

(c) Spray painting: Spray painting of a conductive ink, such as ITO or CNT in a solution form, can be used to prepare electrodes on polymer or glass substrates. For depositing electrodes via spray painting, a stencil is placed as a mask, over the substrate. A single mask can be used for producing several electrodynamic screens for their operation with single-phase ac drive. For three-phase drive, a three-layer spray-painting operation may be needed using three different stencils. The method can be used for roll-to-roll coating.

Critical artwork is needed for generating photolithographic preparation of stencil screens with a high resolution. A laser cutting process is generally used for preparing stencils. If a $CO_2$ laser is used for laser cutting, its resolution is limited by its long wavelength (10.6 μm) setting a theoretical limit of 100 μm. A YAG laser (wavelength 1.06 μm) can provide much better resolution. Highest resolution can be obtained by using an Excimer laser (XeF: 351 nm, ArF: 193 nm). Stencils with 50 μm resolution can be prepared using a YAG laser with an appropriate substrate. Metal stencils can also be used. Stencil screen preparation is labor intensive but the technology can be used for low-cost, large scale production of EDS.

Substrates for EDS (a) EDS substrates: As discussed earlier, the substrate needs to be transparent over the solar radiation spectrum useful for harvesting energy using solar panels. For the operation of the electrodynamic screen for self-cleaning property, the substrates should have a very low volume resistivity in order to sustain electromagnetic field when the electrodes are activated. Borosilicate glass plate, or Fluoropolymer film or Polyethylene Terephthalate (PET) substrate can be used. Polymer sheets are often coated with another polymer (such as vinyl) to improve adhesion properties. Structural modification and surface coatings are made to provide improved durability against UV radiation. (PET is also referred to as Mylar or Polyester, fluoropolymer Tefzel is made by DuPont).

The primary constituents of borosilicate glass (often referred as borofloat glass because of the manufacturing technology used) are $SiO_2$, $B_2O_3$, $Na_2O_3$, and $Al_2O_3$. It is used widely in solar panels as cover glass because of its low iron content, which is desired for a low transmission loss and low coefficient of thermal expansion (approx. $10^{-6}$ cm/cm/° C.). Its refractive index is approximately 1.47 at 589 nm (yellow). Since the EDS operation involves application of an electric field, the substrate should be sufficiently thick to provide an effective insulative barrier layer between the current collecting electrodes on the top surface of the solar panels and the electrodes placed over the cover glass.

(b) Surface treatment of substrates for depositing electrodes: Before the electrode materials are deposited over the substrate, surface treatment may be needed to improve adhesion between the electrodes and the substrates. Atmospheric pressure plasma treatment can be used to clean the surface and improve adhesion of ink with the glass or polymer surface. The electrodes are deposited within a short period after the plasma treatment since the effective life time of plasma surface modification is often limited.

Electrode Layout

Based on our studies on the electrode materials and the methods of deposition of the electrodes on glass or polymer surface, (1) ITO, (2) CNT, (3) Ag—NW nanowires, (4) Graphene, (5) AZO, and (7) conduction Polymer PDOT:PSS with their advantage and disadvantages have been described above. Several methods of electrode deposition technique including (1) screen printing, (2) stencil based spray painting, and (3) photolithographic process are outlined above. Considering the availability of materials, cost, and scalability, application of transparent CNT coating using screen printing or stencil/spray painting method appears to be most promising. Optimization of the process may require combination of different methods. For example, photolithography may be used for making a master of the screen for screen printing method. The electrodes, placed over the substrate, may then be embedded by a transparent dielectric layer of polyurethane (PU) or fluoropolymer with a thickness of 50 μm. Since this outer dielectric front cover is subjected to weatherization, a protective high-dielectric strength film coating may be applied to the electrodes.

As stated before, the UV component of the solar radiation absorbed by the dielectric layer generates charge carriers. In order to protect the high voltage electrodes from current loss and possible breakdown, a thin film of $SiO_2$, with a high dielectric strength ($10^7$ V/cm), with its refractive index (1.46) that matches well with that of borosilicate glass, is applied. A sol gel coating process is used to add a coating layer of approximately two micrometers thickness.

Dielectric Layer as Front Cover (a) Choice of material: The dielectric material that can be used as the front surface cover of the EDS has to meet the following requirements: (1) transparent over the range of solar radiation that can be harvested by the solar cells, (2) UV resistant, (3) excellent contact charging properties, (4) scratch resistant, (5) low refractive index, and (6) moisture resistant. In addition, the polymer surface should have a strong adhesion property for coating, at the back surface to the $SiO_2$ film and for antireflection coating at the front surface.

One of the major challenges is to provide UV resistance over 25 years for EDS applications to solar panels. Most of the unmodified polymers are unstable under UV radiation. Stabilizers, blockers, and absorbers are used to promote UV resistance. However, the modifications should not compromise the transparency of the plastic in the visible spectrum. The stabilizers react with UV radiation. One of the common stabilizers is called HALS (Hindered Amine Light Stabilizer). These absorb the excited groups and prevent the chemical reaction of the radicals. The best UV resistant polymers are the imides. Polyimide (PEI) has been used for space applications. Fluorescent whitening agents (FWA) can be added to the polymer. The FWA molecules can absorb UV photons and undergo fluorescent radiation in the visible range providing additional radiation energy to the solar cells for energy conversion.

PTFE has good UV resistance because of its strong carbon-fluorine (C—F) bond. Fluoropolymer resin (marketed by DuPont as Tefzel) has transparency over 94% in the visible range. Polyurethane (PU) and silicone have good UV resistance.

Since the surface to be coated is a film of $SiO_2$, it may be necessary to pre-treat the surface by plasma for a good adhesion. An electrospray can be used to apply an organic solution of the resin. Alternatively, the resin powder can be applied using an electrostatic powder spraying process. The particle size distribution needs to be controlled ($d_{max}$<20 μm) for a thin film coating.

Another approach is to use thin film of Tefzel with an adhesive backing which would allow cementing the film on the surface of the borosilicate glass plate with the electrodes placed on the surface and covered by a thin film of $SiO_2$. This method has the advantage that if the film degrades after its operation for several years, it can be replaced relatively easily.

Antireflection Coating and Light Trapping

The function of EDS is to improve transmission of light to the solar cells by removing dust layers from the front surface of the solar panels. It is therefore important to make the process efficient to provide highest efficiency for the transmission of solar radiation to the solar cells. Antireflection coating is often used for minimizing reflection losses. Typically, a transparent material with refractive index equal to the square root of the substrate's refractive index (since the refractive index of air is close to 1.0) is applied with a thickness of equal to the $\frac{1}{4}^{th}$ of the wavelength at the middle of the visible spectrum. Magnesium Fluoride (refractive index 1.38) is used most commonly for crown glass.

Fluoropolymer (refractive index 1.3) coating can also be used but controlling the film thickness is much more difficult. An alternative layer of $SiO_2$ and $MgF_2$ can reduce the reflection loss down to 0.1%. Pyramidal-shaped textures are commonly used for trapping sun light over a large angle of incidence.

Conventional antireflective coating is highly effective at one wavelength. For an effective antireflective coating to cover the entire spectrum of the visible radiation, nanostructured surfaces are used to trap light and minimize reflection. Nanostructured pyramids have been successfully applied by chemically engraving the top Si surface of the c-Si solar cells. Since Si has a high refractive index, all c-Si solar cells are made with textured front surface. When the solar cells are placed under a cover glass, there is still reflection loss due the air-glass surface mismatch in refractive indices. Solar panels constructed with front glass cover generally suffer reflection loss from the glass front surface. Without any treatment, glass reflects 4% of the incident light even when the light is incident at an angle of incidence 90°. As the angle of incidence changes from normal incidence, the reflection loss increases.

A broadband antireflection coating can be achieved by using nanostructured surface or by using a nanoporous surface coating. Use of nano-sized cavities has shown promising results. Our approach is to place nano-sized planoconvex lens assembly to minimize reflection and trap sunlight.

Dust Removal Mechanisms

To understand the mechanisms involved in the removal of the dust particles, there is consideration of two forces applied by the electrodynamic field on particles approaching or residing on the screen: (1) electrostatic (Coulomb) force, and (2) dielectrophoretic force. The Coulomb force is applied when the particles are charged or become charged in contact with the screen. The dielectrophoretic force applies to both uncharged and charged particles.

(i) Electrostatic Force:

In this analysis it is assumed that charged particles, each with total charge q and radius r, are initially uniformly distributed on or just above the surface of the screen and that their self-field is very small compared to the applied field. We also assume that the Coulomb force, qE, on the particles gives them a drift velocity opposed by Stokes' viscous drag where the medium (air) for z>0, has viscosity η

$$6\pi\eta rv = qE$$

The particle's mobility is then $$\mu = v/E = q/6\pi\eta r$$

Neglecting particle inertia gives the x (horizontal) and z (vertical) components of particle velocity, $$v_x = \mu E_x$$

$$v_z = \mu E_z$$

A particle with diameter r, and a charge +q, and subjected to a sinusoidal excitation voltage generating an electric field $E_o \cos(\omega t)$, move with a velocity $V_p(t) = V_{po} \cos(\omega t - \phi)$, where is the phase lag of the particle motion with respect to the applied electric field. The particle with charge +q moves along the curved lines of force between the adjacent electrodes. A positively charged particle will experience two forces of repulsion, one tangential to the curved field lines and the other normal to the curved path. The normal component is the centrifugal force which arises due to the curvilinear motion of the particles. This normal component provides the lift force. Similarly, a particle with a negative charge −q will experience identical motion with repulsive forces.

If the particle is resting initially on the surface, the particle will roll or have translational motion on the surface of the screen. The particle will gain a positive or a negative charge by multiple contacts with the surface of the screen, causing the repulsion forces to increase moving the particles away from the surface. Such particle motion may be observed using large particles with diameter 60-80 µm placed on the screen.

Uncharged particles, in contact with the polymer surface of the screen acquire charge by the contact charging process. The alternating electric field induces a back and forth motion of the particles which increases the charge on the particles by the triboelectric charging process. This process continues for a few seconds until the Coulomb force is strong enough to lift the particles from the surface. The standing wave patterns formed by single-phase drive system have both x- and z- components; the inertia of the particle motion that causes phase lag and asymmetry of the standing wave pattern cause a translational motion of the charged particles; the particles are removed from above the surface of the screen.

When the EDS electrodes are energized by a three-phase voltage, a travelling wave is generated in the electric field. When the charged particles are lifted off from the surface by the vertical component of the field ($E_z$), the travelling wave component propels the dust to the edge of the screen. The removal process is more efficient when a three phase voltage is applied.

(ii) Dielectrophoretic Force:

A dielectric particle in a non-uniform electric field experiences a dielectrophoretic force. This force is experienced by dielectric particles, uncharged or charged, in any divergent electric field, AC or DC. An electric field E produces certain displacements of the electrons and ions within a dielectric particle. This process is similar to the polarization of any atom when an external electric field distorts the electron cloud with respect to the nucleus of the atom. In a microscopic particle, when two charges +q and −q are separated by a distance d, a dipole of moment qd is formed. The combined effect of each of these elementary dipoles within a microscopic particle can be considered as a single polarization vector P. By virtue of the dipole moment induced on the particle, placed in a non-uniform electric field, the particle experiences dielectrophoretic force. The applied voltage on the electrodes creates a gradient in the electric field. The divergence of the electric field applies a dielectrophoretic force $F_d$ on the particle with a dipole moment, $$\overline{F}_d = (\overline{P}\nabla)\overline{E}$$

where, P is the polarization vector (field induced dipole moment) and is equal to np, where p=qd, the dipole moment for each individual dipole within a single particle and n is the number of dipoles. The translational dielectrophoretic force $F_d$ is proportional to the product P and grad. E. A spherical particle of radius r having a dielectric constant $\epsilon_2$, resting on a medium of dielectric constant $\epsilon_1$, and surrounded by a electric field gradient, will experience a force $F_d$ which can be expressed as, $$F_d = 2\pi r^3 \epsilon_1 \frac{\epsilon_2 - \epsilon_1}{\epsilon_2 + \epsilon_1} \nabla |E|^2.$$

The direction of the force $F_d$ (top bar is used for vector notation) depends upon the sign of the term ($\epsilon_2 - \epsilon_1$). If the dielectric constant ($\epsilon_2$) of the particle is higher than the dielectric constant of the medium ($\epsilon_1$), the particle will move toward the high field region. The dielectrophoretic force will be attractive in this case. In a non-uniform and oscillating electric field, the dielectrophoretic force on the particle can induce frictional motion of dielectric particles on the surface of the screen.

The above analysis does not take into account of the dielectric constant of the polymer screen embedding the electrodes. If we consider the point of contact between particle surface and the surface of the polymer screen, the distribution of the electric field is different from that of the areas of particle surface exposed to air. This difference in the field distribution also causes a force in moving the particle.

In an alternating field, an uncharged dielectric particle approaching the electrodynamic screen will oscillate and roll back and forth. As the particle makes contact with the surface of the screen, the movement of initially neutral particles on the surface of the screen will cause electrostatic charging by triboelectrification. The acquired electrostatic charge, positive or negative, on the particles will add Coulomb force of repulsion lifting and removing the particles above the surface.

The combination of Coulomb and dielectrophoretic forces moves the dust particles on the surface of the screen, which causes the particles acquire additional electrostatic charge due to the tribocharging effect. The charged particles are then repelled by electrostatic force.

(iii) Tribocharging of Particles:

When a particle, in contact with a dielectric film, move or roll against the film surface, even with small amplitude of motion, it acquires a triboelectric charge. The initial motion could be due to (1) Coulomb force, if the particle was initially charged, or (2) dielectrophoretic force which is independent of the initial charge of the particle, or (3) other forces such as gravitational force. The associated friction against the surface of the screen causes the particle to exchange charge with the surface of the screen. The polarity and magnitude of the charge depends upon the work function difference between the two contacting surfaces. The added charge on the particle increases the amplitude of particle motion due to the increased electrostatic force in an alternating and divergent electric field. When the repulsive force becomes sufficiently high, the particle is removed from the surface.

(iv) Surface Charge Removal from the Polymer Film:

Since there is a charge exchange between the particle and the screen surface, the surface of the screen becomes charged with equal and opposite polarity. Thus, there is a force of attraction between the screen and the particles. The applied alternating electric field must overcome this attractive force for removing the particles. It is, therefore, necessary to reduce the surface charge of the screen by providing a leakage path against an excessive charge buildup on the screen. The dielectric film, within which the electrodes are embedded, should have an optimum loss factor. The conductivity ($\sigma$) of the film should be low enough to sustain a high electric field over its surface by the voltage applied to the embedded electrodes and yet high enough to prevent an excessive charge buildup on its surface. When the surface and bulk conductivity is well controlled, some of the surface charge on the screen will leak to the conducting electrodes and rest of the charges to the supporting metal frame.

The surface conductivity of the polymer film is subjected to change due to the deposition of dust, contamination, moisture absorption, and UV radiation. If the surface is made highly hydrophobic, it will have stain-resistant properties and is thus desirable for an optimum operation of the electrodynamic screen. Since hydrophobic surface will be moisture resistant, there will be less variation of the surface conductivity as a function of relative humidity of the ambient air.

Besides the work function difference, the charge level acquired by the particle will also depend upon the force of adhesion between the particle and the screen surface and the environmental factors such as relative humidity. Movement of dry particles against a dry hydrophobic surface provides a desirable condition for dust removal. As the particles become increasingly charged, the attractive force between the particle and the screen oppose particle motion. However, as the surface charge drains off from the film surface, the charge exchange process can continue for dust removal. Both proximity of the parallel electrodes with the surface and the inter-electrode spacing play an important role in the charge leakage process.

(v) Removal of Uncharged and Charged Particles:

As discussed above, uncharged dielectric particles, deposited on the screen, begin to move on the surface of the dielectric film by the dielectrophoretic force. The particles acquire electrostatic charge rapidly depending upon the strength of the divergent electric field. If the permittivity of the particle is higher than that of the medium, the dielectrophoretic force pulls the particle towards the region of higher field intensity. Since the force is proportional to the square of the field gradient and the field oscillates at the frequency of the applied voltage, the fluctuations of the dielectrophoretic force of attraction on the particle makes it to roll along the field gradient lines on the dielectric film surface.

Movement of particles on the dielectric surface of the screen causes the particles to be charged by friction (triboelectrification) to a high charge level. Thus the initially uncharged particles deposited on the screen are charged rapidly. The net gain of charge on the particles adds Coulomb force of repulsion causing particles to be lifted off the surface and be removed. The repulsive force in the direction normal to the screen surface is caused by the curved path of the particle motion in an oscillating electric field and the phase lag of the particle. The phase lag of the particle motion with respect to the electric field depends upon the product of the frequency of excitation and the relaxation time of the particle. The charged particles experience a translational motion when a three-phase voltage is applied.

The mechanisms of removal of the particles from the surface are similar when the particles have initial charge, either with positive or negative polarity. For charged particle, the Coulomb force dominates in inducing particle motion. Thus the dust particles, with or without any initial charge, deposited on the EDS screen are effectively removed by the divergent and oscillating electric field.

(vi) Effect of Particle Conductivity on the EDS Operation:

The triboelectric charging of the dielectric particles plays an important role in the removal of dust from the screen. In most cases, dust particles have low conductivity containing metal oxides. However, in some cases, when there is a significant concentration of iron oxide or moisture, particles may be conductive. Conductive particles can acquire charge by induction process, as described below, and be removed from the surface of the screen provided deposition of dust does not make the surface of the screen conductive. A conductive film surface of an EDS cannot sustain an electromagnetic field due to Faraday shield effect.

(vii) Removal of Uncharged Conducting Particles:

The process of electrostatic charging and removal also works for conducting particles deposited on an EDS. The particles, initially uncharged and deposited on the dielectric screen, will experience a force due to the induced charge. The charge q on a spherical particle deposited on a dielectric film can be approximated as $$q \propto E_0 r^2$$

where r is the radius of the particle and $E_o$ is the magnitude of the instantaneous electric field. In this figure, we show two particles on the film surface, one close to an electrode when it is positive and the other close to an electrode when it is negative. The electric field polarizes the conducting particles as shown. The particle close the electrode at the time when it is positive, has negative charge at the sites where the particle is close to the electrode and in contact with the film surface. Since the film surface has a finite conductivity, part of this negative charge flows to the film and thus the particle is left with a net positive charge. This net positive charge on the particle causes a repulsive force on the particle from positive electrode while being attracted to an adjacent negative electrode. Similarly, a particle close to an electrode when it is negative acquires a net negative charge and is attracted to a positive electrode. The force of repulsion is:

$$F = qE_0 \approx E_0^2 r^2.$$

When the repulsion force is larger than the force of adhesion between particle and the surface, the particle will be lifted off the surface. As the particle, move in a curved path, it experiences a force of repulsion similar to that of a particle with an initial charge q. The adhesion force on the particle is the sum of the van der Walls force and force of attraction due to the image force. Since the particle is an alternating field, the direction of the electrostatic force changes causing the particle to have a rolling or translational motion on the surface. Such a motion results in triboelectric charging of the particle which increases the Coulomb force.

(viii) Frequency of EDS Electrode Excitation:

The frequency of the applied electric field has a critical role in the particle charging and repulsion processes. Since the particle motion on the screen depends upon the inertia of the particles and the frictional forces involved, the frequency of the applied electric field needs to be low in most cases of dust removal. Since the motion of the particles on the surface depends upon the frictional force and the drag coefficient when it is airborne, the optimum frequency of EDS operation is adjusted based on these parameters involving the size distribution, density, and the mobility of the particles. The electrostatic repulsion of the particles depends upon the normal component of the electrostatic force in the curved path of motion the particles and the phase lag between the electric field and particle velocity. Since an alternating electric field is needed for providing a lift force for removing the particles from the surface, the frequency of the electric field is adjusted high enough to induce inertia-dominated curvilinear motion of the particles. Typically, the frequency of operation is in the range from 4 to 20 Hz.

While the above description is focused primarily on applications for solar collectors such as PV panels and PT collectors, as also mentioned the presently disclosed techniques may be employed in other applications. Most generally, the techniques may be useful in a variety of applications in which it is desired to shed particles from a surface of a structure. The techniques may be particularly applicable with transparent structures such as screens, windows, lenses etc. In one example, a screen is a visual display screen of a computer or visual display system. Most generally, though, the techniques may be useful wherever automated removal of particles from a surface of a structure is desired, whether for maintaining transparency or for some other reason.

While various embodiments of the invention have been particularly shown and described, various changes in form and details may be made therein without departing from the scope of the invention as defined by the appended claims.

What is claimed is:

1. A film assembly usable to self-remove particles of material deposited thereon, comprising:
a film of transparent material; and
a set of elongated conductive electrodes carried by the film, the electrodes being configured to be connected to a source of electrical power and to generate an electric field across a surface of the film in response thereto, the electric field being of sufficient strength to remove the particles from the surface of the film by electrodynamic action, the electrodes being separated from adjacent portions of the film by a coating of a dielectric material having substantially higher dielectric strength than a dielectric strength of the film to protect against dielectric breakdown during operation.

2. The film assembly of claim 1, wherein the dielectric material includes a transparent polymer and/or an inorganic transparent film.

3. The film assembly of claim 1, wherein the transparent polymer is of a material selected from polyurethane, acrylic, or a fluoropolymer.

4. The film assembly of claim 2, wherein the inorganic transparent film is of a material selected from silica and or silicon nitride.

5. The film assembly of claim 1, wherein the conductive electrodes of the film assembly are transparent conductive electrodes, and further including a coating of silica disposed between the dielectric material and a surface of the cover of the solar collector for protecting the conductive electrodes.

6. The film assembly of claim 1, wherein an outer surface of the film assembly has nanotextured topography to trap light and reduce reflection losses.

7. The film assembly of claim 1, wherein:
a transparent polymer or transparent inorganic film is used for encapsulating the conductive electrodes; and
a primer coating of thin film is used for increasing adhesiveness.

8. The film assembly of claim 1, wherein the transparent material has two sub-layers, and an outermost one of the sub-layers includes a self-adhesive backing usable to adhere the film assembly to a separate component.

9. The film assembly of claim 8, wherein the self-adhesive backing includes a pressure sensitive adhesive allowing for placement of the film aided by vacuum lamination on a surface of the separate component.

* * * * *